(12) United States Patent
Ikeda (10) Patent No.: US 8,228,671 B2
(45) Date of Patent: Jul. 24, 2012

(54) ELECTRONIC APPARATUS INCLUDING A COOLING UNIT AND A WALL MEMBER

(75) Inventor: Kensuke Ikeda, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 183 days.

(21) Appl. No.: 12/752,328

(22) Filed: Apr. 1, 2010

(65) Prior Publication Data

US 2010/0254086 A1 Oct. 7, 2010

(30) Foreign Application Priority Data

Apr. 2, 2009 (JP) ................................. 2009-090572

(51) Int. Cl.
 *H05K 7/20* (2006.01)
 *H01L 23/34* (2006.01)
 *F28F 7/00* (2006.01)

(52) U.S. Cl. ................. 361/679.49; 165/80.3; 165/80.5; 165/104.33; 257/715; 257/722; 361/679.47; 361/679.5; 361/697; 361/700

(58) Field of Classification Search .. 361/679.47–679.5, 361/679.54, 696, 697, 700; 165/80.3–80.5, 165/104.33, 185; 257/713, 715, 721–722; 174/15.1, 16.3; 454/184
See application file for complete search history.

(56) References Cited

U.S. PATENT DOCUMENTS

| | | | |
|---|---|---|---|
| 6,400,563 B1* | 6/2002 | Mohi et al. ................ | 361/679.47 |
| 6,488,126 B1 | 12/2002 | Yamakawa et al. | |
| 6,574,100 B1* | 6/2003 | Anderson ................... | 361/679.5 |
| 7,457,113 B2* | 11/2008 | Kumhyr et al. ........... | 361/679.48 |
| 7,848,101 B2* | 12/2010 | Dey et al. .................. | 361/679.51 |
| 2004/0085727 A1* | 5/2004 | Kim .............................. | 361/687 |
| 2004/0095722 A1* | 5/2004 | Rong-Yao ..................... | 361/695 |
| 2006/0148398 A1* | 7/2006 | Ruch et al. ..................... | 454/184 |
| 2007/0097634 A1* | 5/2007 | Chang ........................... | 361/695 |
| 2010/0254085 A1* | 10/2010 | Hasegawa et al. ............ | 361/695 |
| 2010/0296251 A1* | 11/2010 | Chen et al. .................... | 361/700 |
| 2011/0226451 A1* | 9/2011 | Ikeda et al. .................... | 165/121 |

FOREIGN PATENT DOCUMENTS

CN 1356957 7/2002
JP 2004-119621 4/2004

OTHER PUBLICATIONS

Chinese Office Action dated Aug. 17, 2011, from corresponding Chinese Application No. 201010155483.4.

* cited by examiner

*Primary Examiner* — Zachary M Pape
(74) *Attorney, Agent, or Firm* — Katten Muchin Rosenman LLP (57) ABSTRACT

Provided is an electronic apparatus capable of also supplying sufficient air flow to a heat generating device other than the heat sink. An electronic apparatus includes: a cooling unit (10) including a heat sink (13), and a cooling fan (15) for generating air flow for receiving heat of the heat sink (13); an upper wall member (40) connected to the cooling unit (10) so as to form an outer wall defining an air passage continuous with the cooling unit (10); and a power circuit (17) arranged in the air passage and serving as an object to be cooled.

4 Claims, 12 Drawing Sheets

ELECTRONIC APPARATUS INCLUDING A COOLING UNIT AND A WALL MEMBER

CROSS-REFERENCE TO RELATED APPLICATION

The present application claims priority from Japanese patent application No. 2009-090572 filed on Apr. 2, 2009, the content of which is hereby incorporated by reference into this application.

BACKGROUND OF THE INVENTION

1. Field of the Invention

The present invention relates to technology for improving cooling performance for a device installed in an electronic apparatus.

2. Description of the Related Art

There is available an electronic apparatus, such as a game device, a personal computer, and audio-visual equipment, which includes a heat sink and a cooling fan for generating air flow receiving heat of the heat sink. In an electronic apparatus disclosed in JP 2004-119621 A, a cooling fan is adjacent to a heat sink, so that air flow generated by the cooling fan flows through the heat sink while hardly diffusing. With this configuration, it is possible to obtain a satisfactory cooling effect for the heat sink.

Besides the heat sink, a device for generating heat (hereinafter, referred to as heat generating device), such as a power circuit, is installed in the electronic apparatus. When compared to the heat sink, the heat generating device is normally arranged further away from the cooling fan. Therefore, it is sometimes difficult to supply a sufficient air flow to the heat generating device.

SUMMARY OF THE INVENTION

The present invention has been made in view of the above-mentioned problem, and an object of the present invention is therefore to provide an electronic apparatus capable of supplying sufficient air flow also to a heat generating device other than a heat sink.

In order to solve the above-mentioned problem, an electronic apparatus according to the present invention includes: a cooling unit including a heat sink, and a cooling fan for generating air flow for receiving heat of the heat sink; a wall member connected to the cooling unit so as to form an outer wall defining an air passage continuous with the cooling unit; and a heat generating device arranged in the air passage and serving as an object to be cooled.

According to the present invention, it is also possible to supply sufficient air flow to the heat generating device.

Further, according to one aspect of the present invention, the wall member is arranged surrounding the air passage. According to this aspect, it is possible to supply a larger amount of air flow to the heat generating device.

Further, according to another aspect of the present invention, the electronic apparatus further includes: a housing forming an outer surface of the electronic apparatus; and an air outlet through which the air in the housing is discharged to the outside of the housing. Still further, the wall member forms the outerwall defining the air passage extending from the cooling unit to the air outlet. According to this aspect, it is possible to smoothly discharge the air flow having passed the heat generating device that warms up to the outside of the housing.

Further, according to still another aspect of the present invention, the cooling unit includes a cover covering the heat sink and guiding the air flow generated by the cooling fan to the heat sink. Still further, the wall member is connected to the cover. According to this aspect, the air flow is allowed to flow smoothly from the heat sink to the heat generating device.

Further, according to still another aspect of the present invention, the air passage includes a main passage through which an air flow for cooling the heat generating device flows, and a bypass passage partitioned from the main passage. According to this aspect, it is possible to improve the ventilation efficiency.

Further, according to this aspect, the heat generating device includes a circuit board having a front surface on which an electronic component is mounted, the main passage is defined as an air passage on a front surface side of the circuit board, and the bypass passage is defined as an air passage on a back surface side of the circuit board. According to this aspect, it is also possible to cool the back surface side of the circuit board.

DETAILED DESCRIPTION OF THE INVENTION

Figure 1:
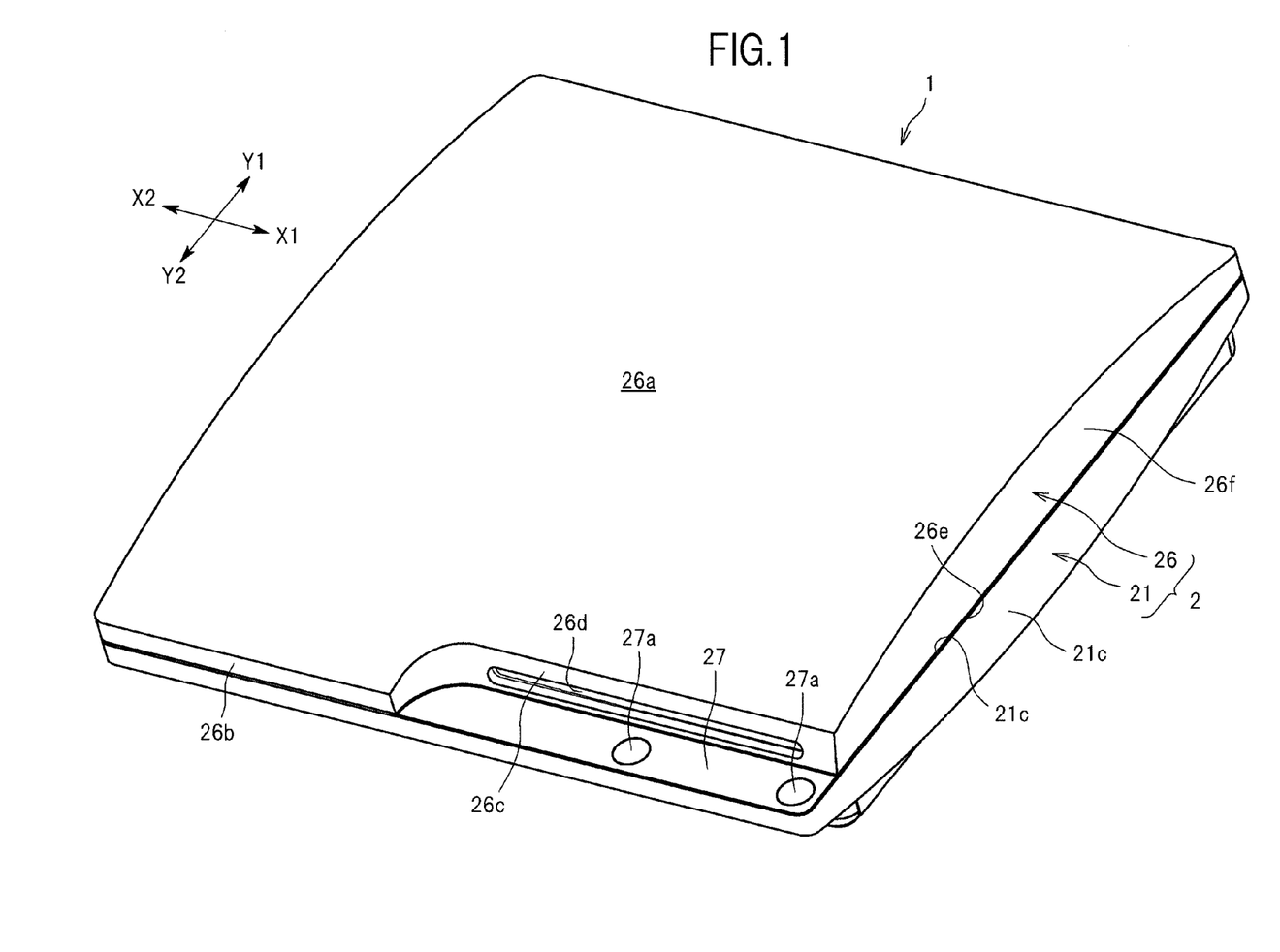
FIG. 1 is a perspective view of an electronic apparatus as an example according to an embodiment of the present invention.
Figure 2:
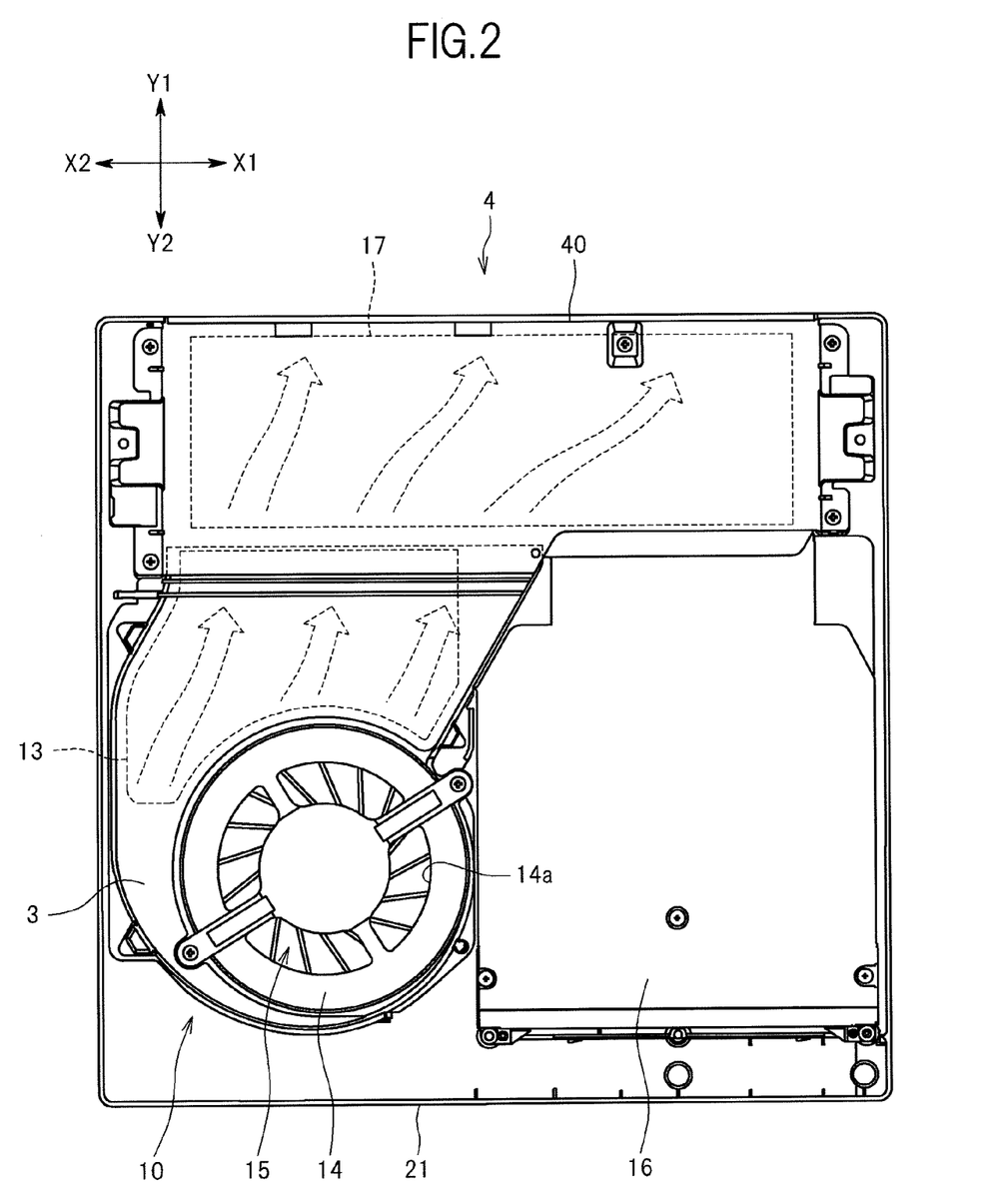
FIG. 2 is a plan view of the electronic apparatus in a state in which an upper housing is detached therefrom.
Figure 3:
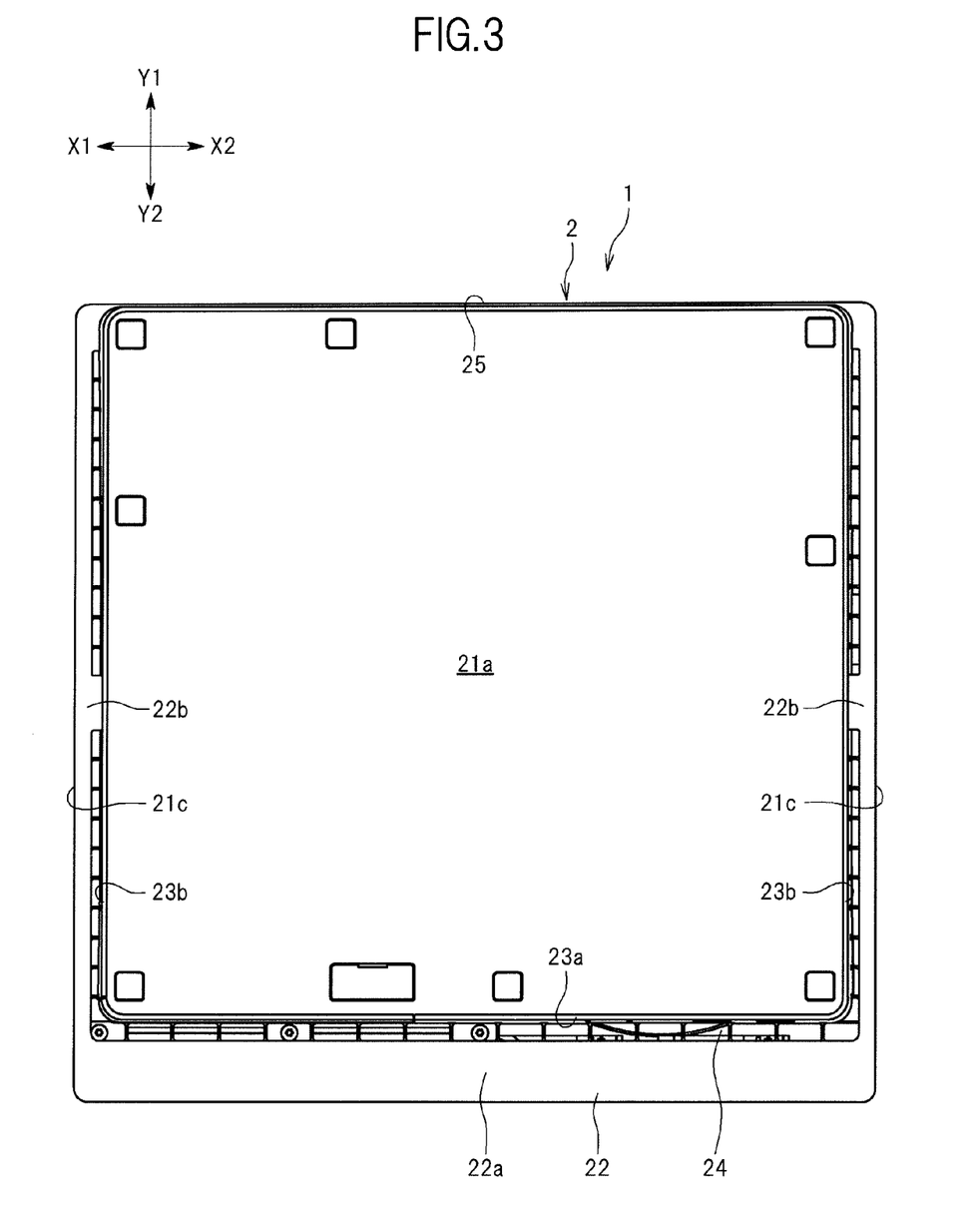
FIG. 3 is a bottom view of the electronic apparatus.
Figure 4:
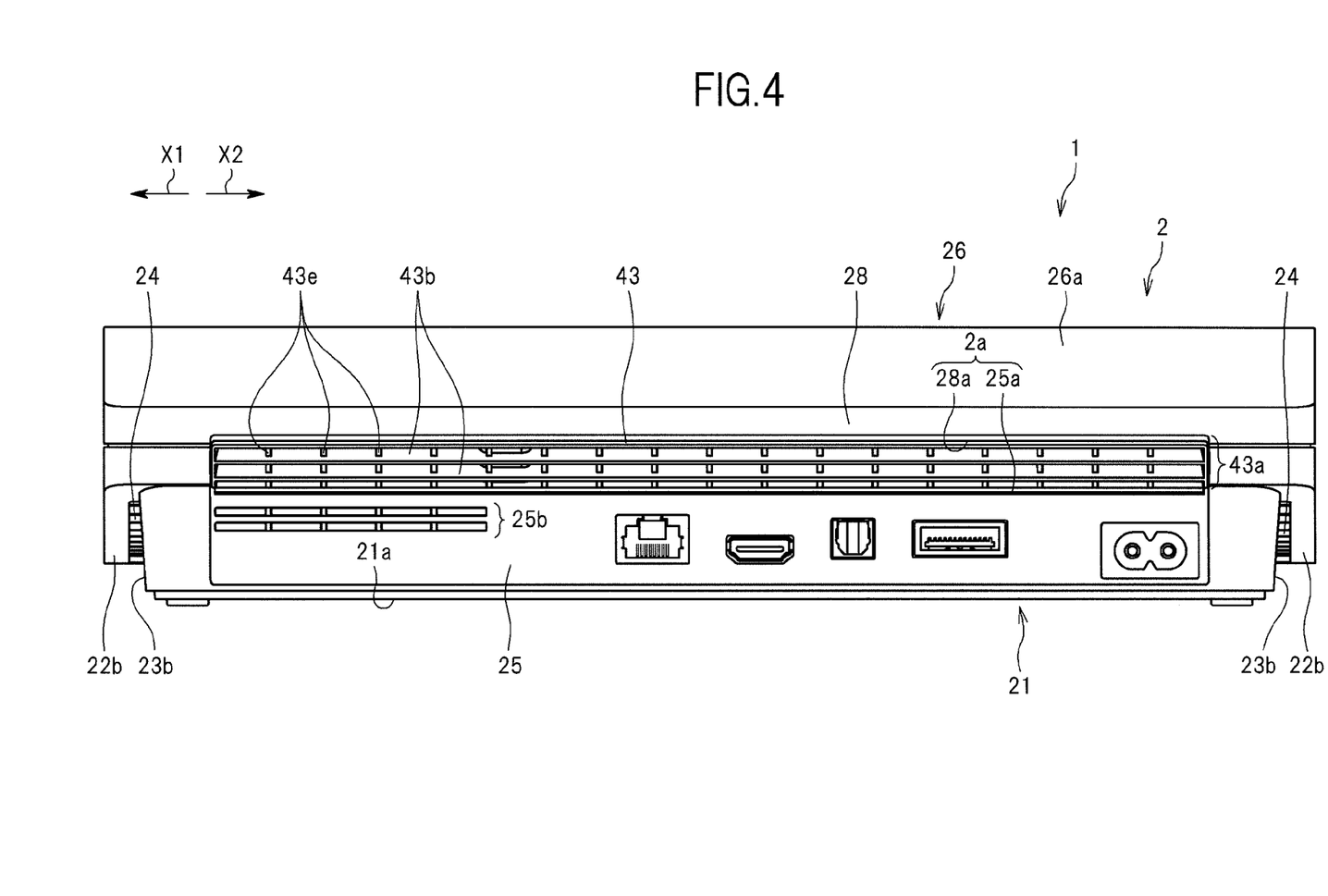
FIG. 4 is a back view of the electronic apparatus.
Figure 5:
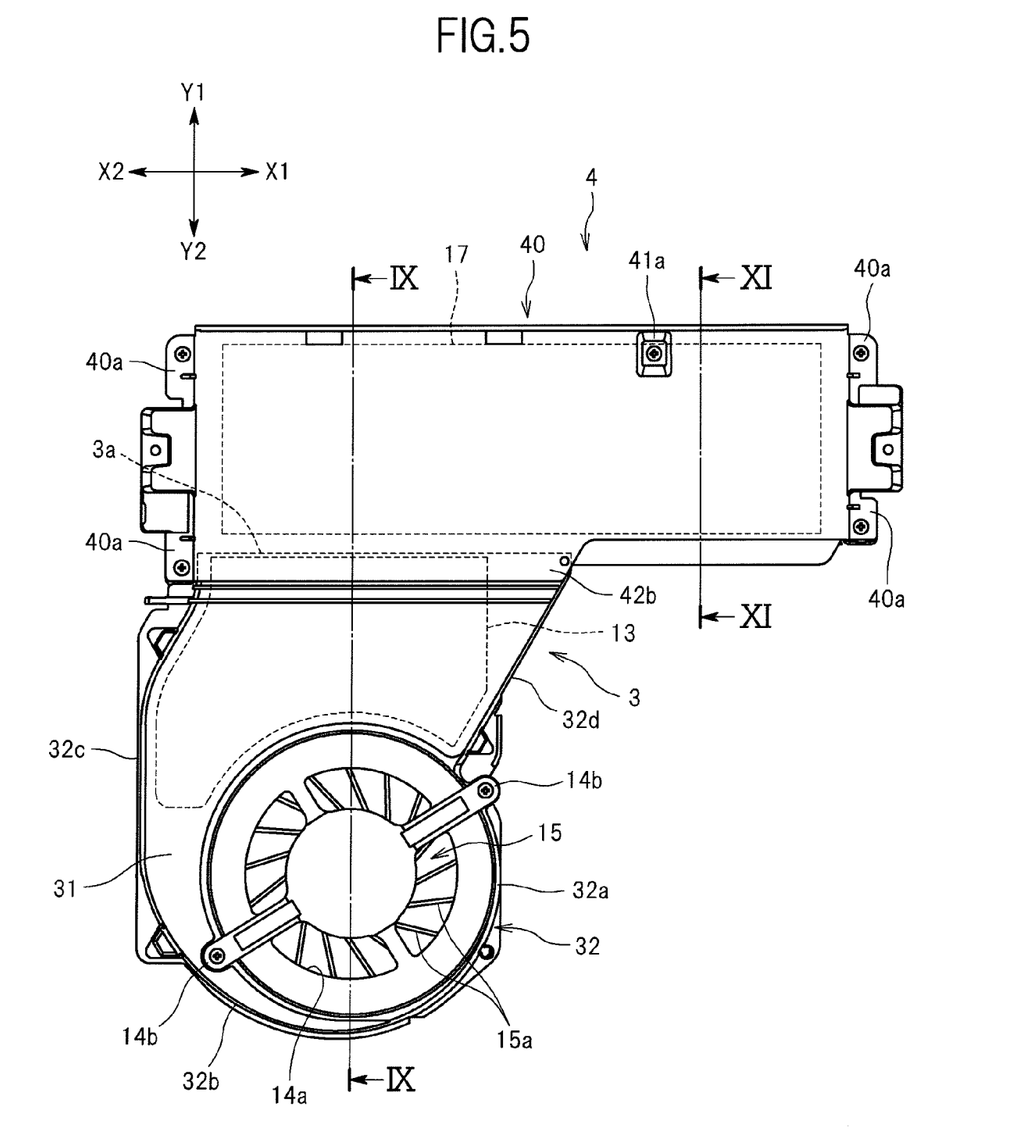
FIG. 5 is a plan view of a cooling unit of the electronic apparatus and a power circuit case housing a power circuit.
Figure 6:
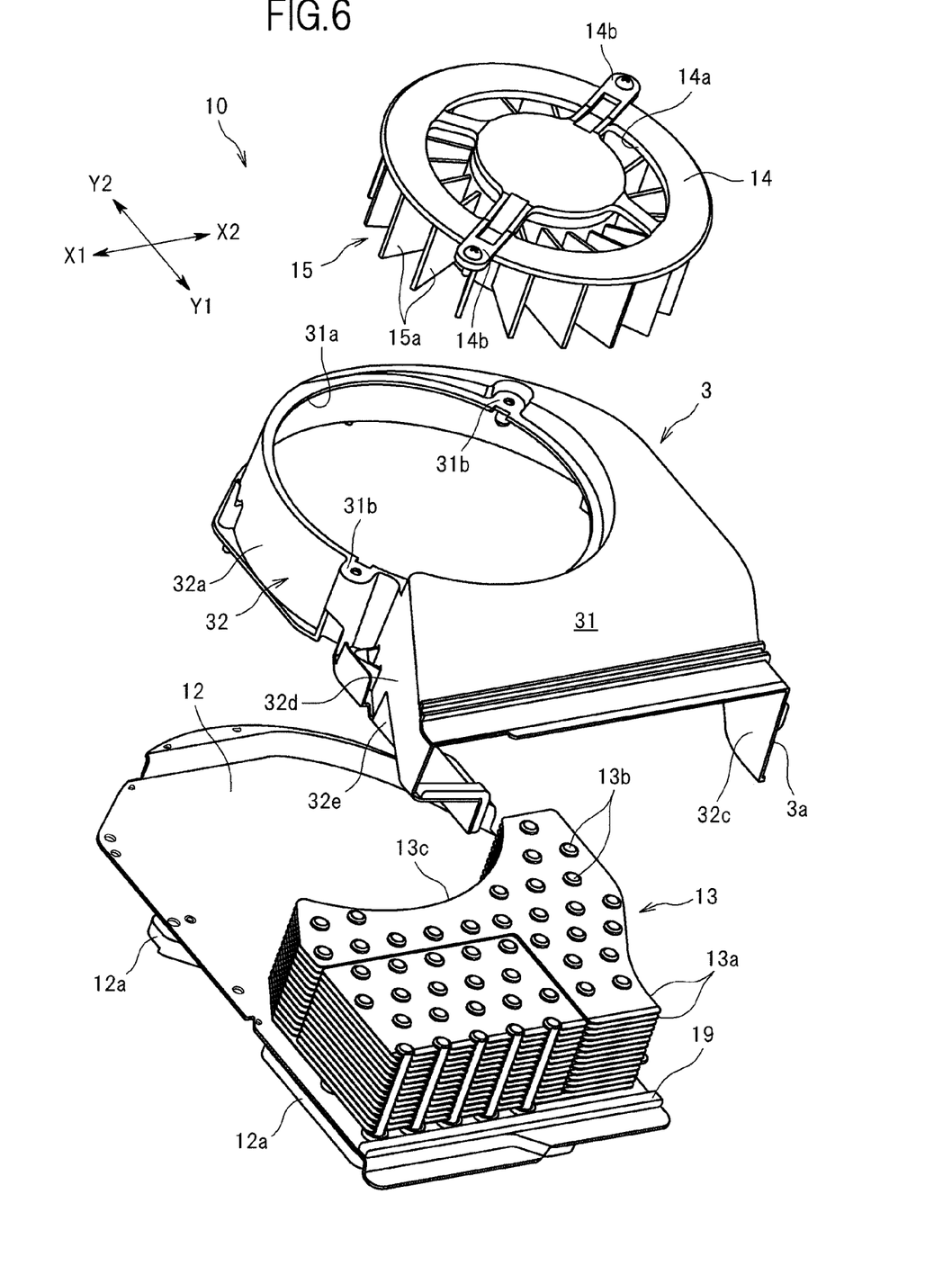
FIG. 6 is an exploded perspective view of the cooling unit.
Figure 7:
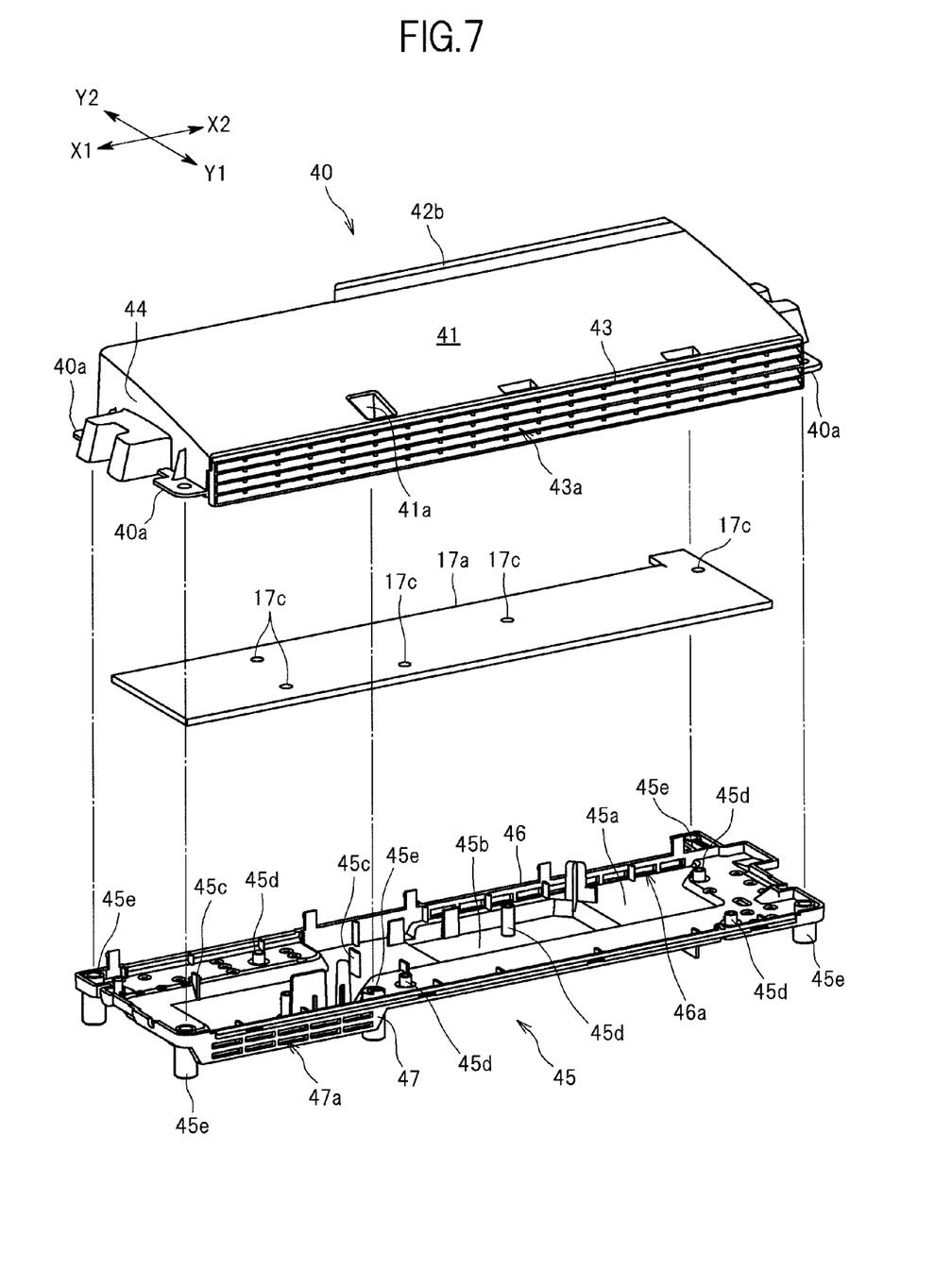
FIG. 7 is an exploded perspective view of the power circuit case.
Figure 8:
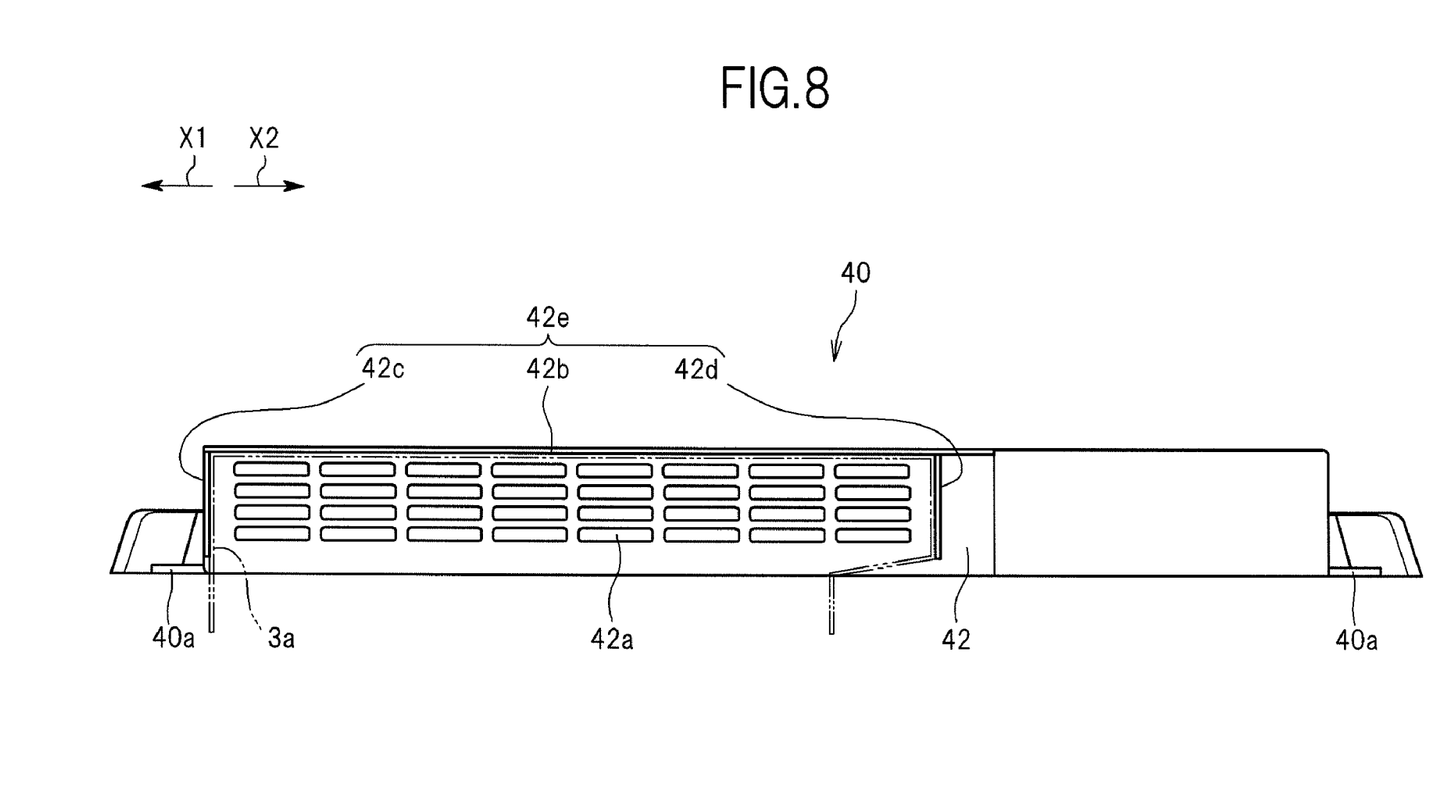
FIG. 8 is a front view of an upper wall member constituting the power circuit case.
Figure 9:
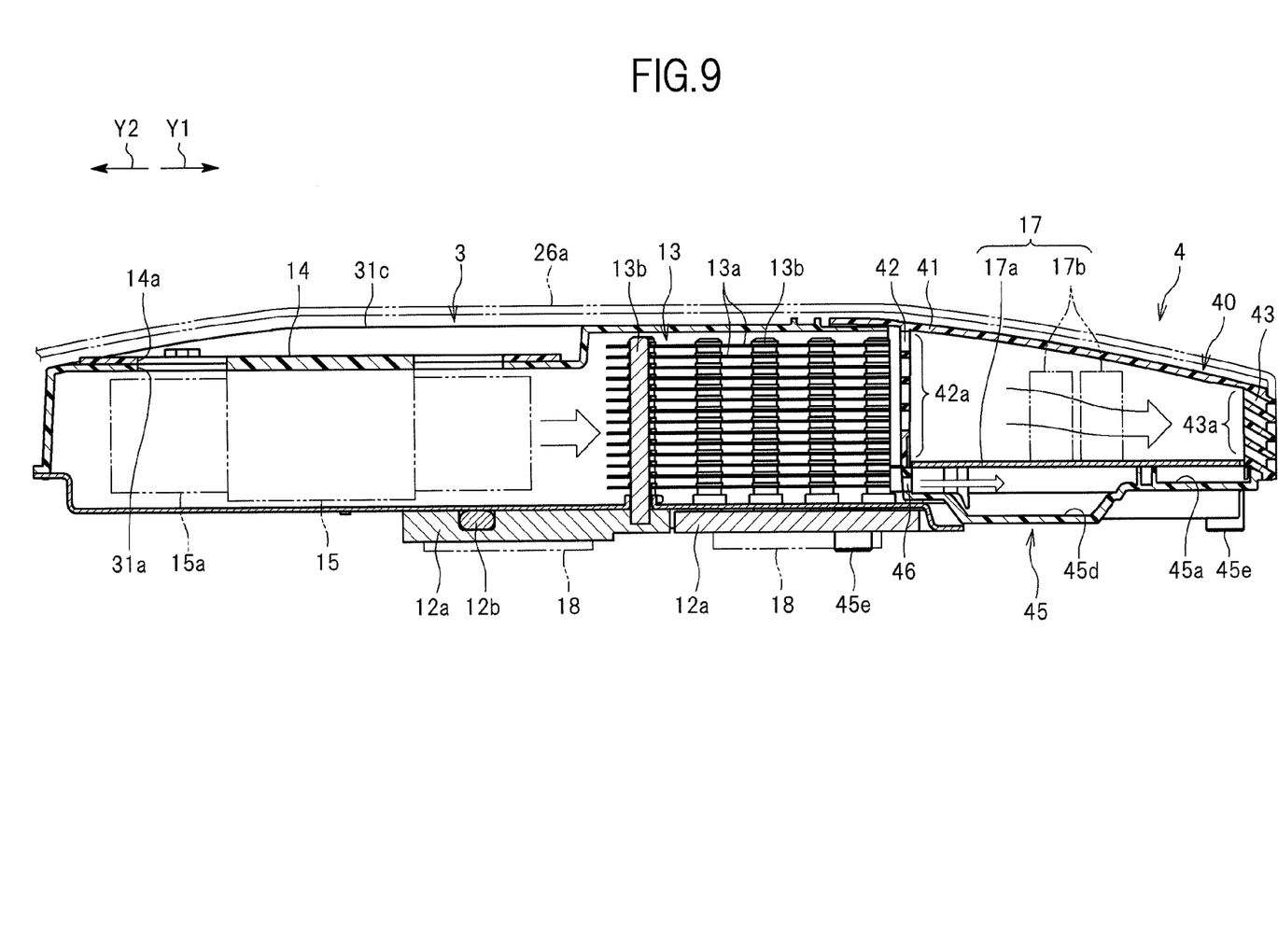
FIG. 9 is a sectional view taken along the line IX-IX of FIG. 5.
Figure 10:
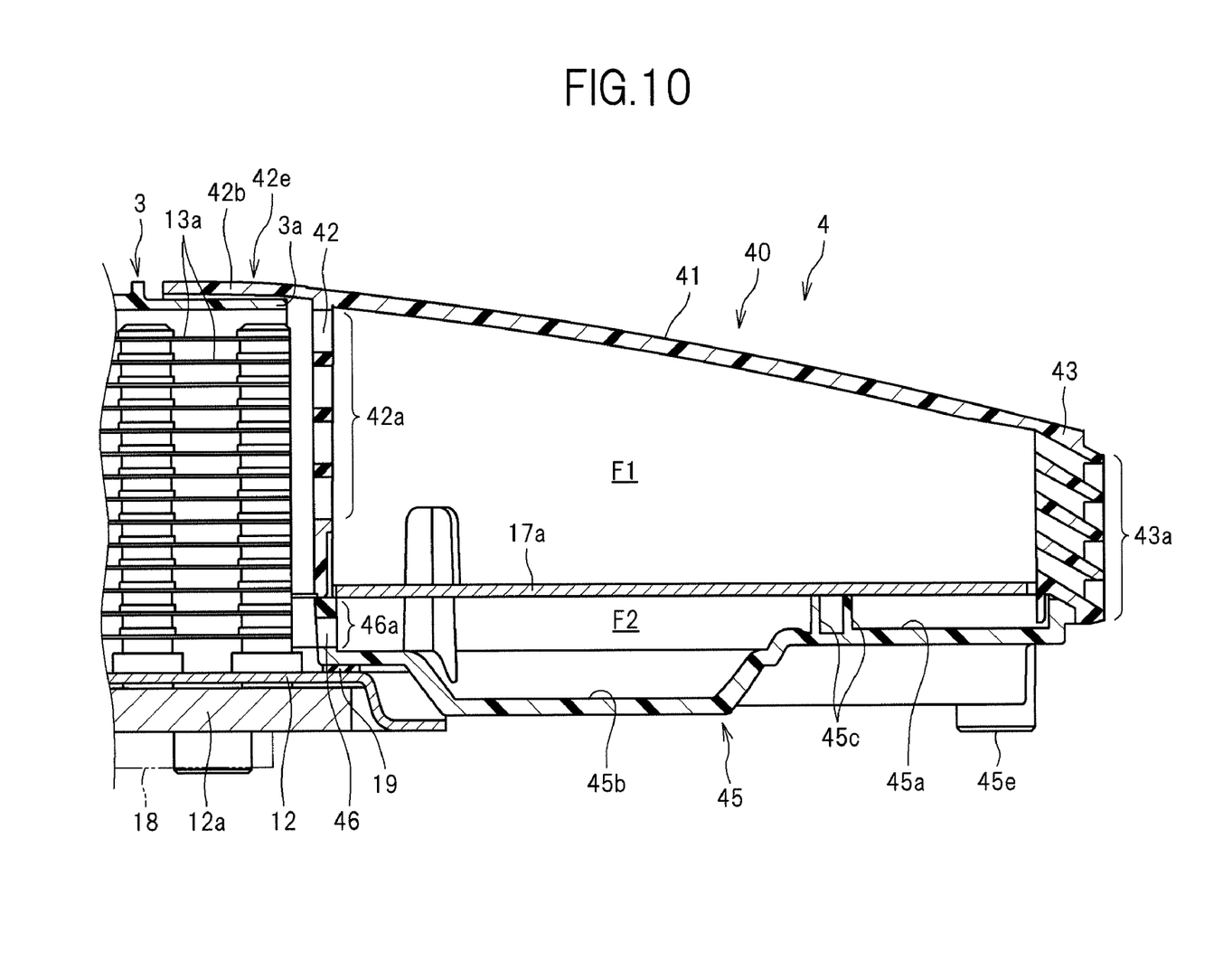
FIG. 10 is an enlarged view of FIG. 9.
Figure 11:
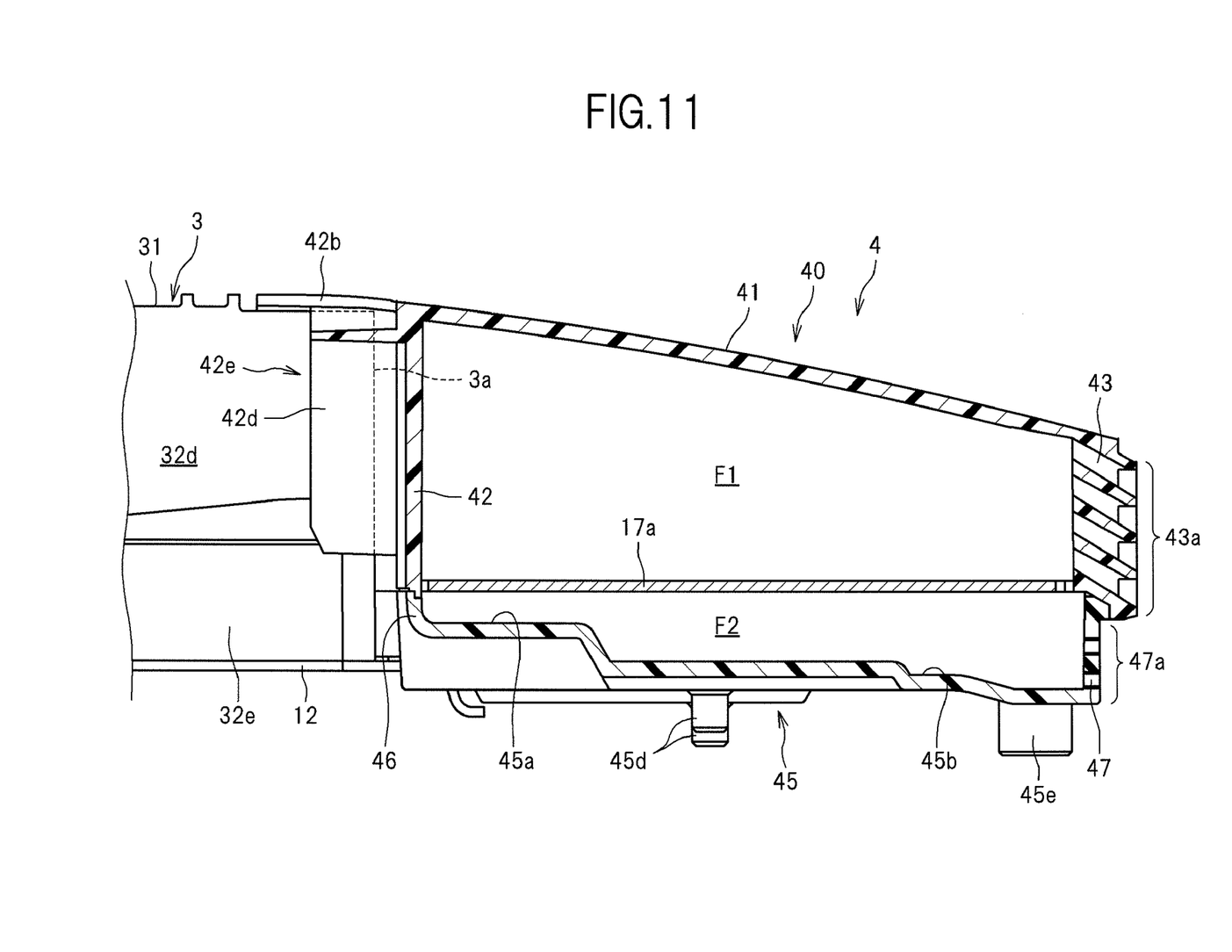
FIG. 11 is a sectional view taken along the line XI-XI of FIG. 5.
Figure 12:
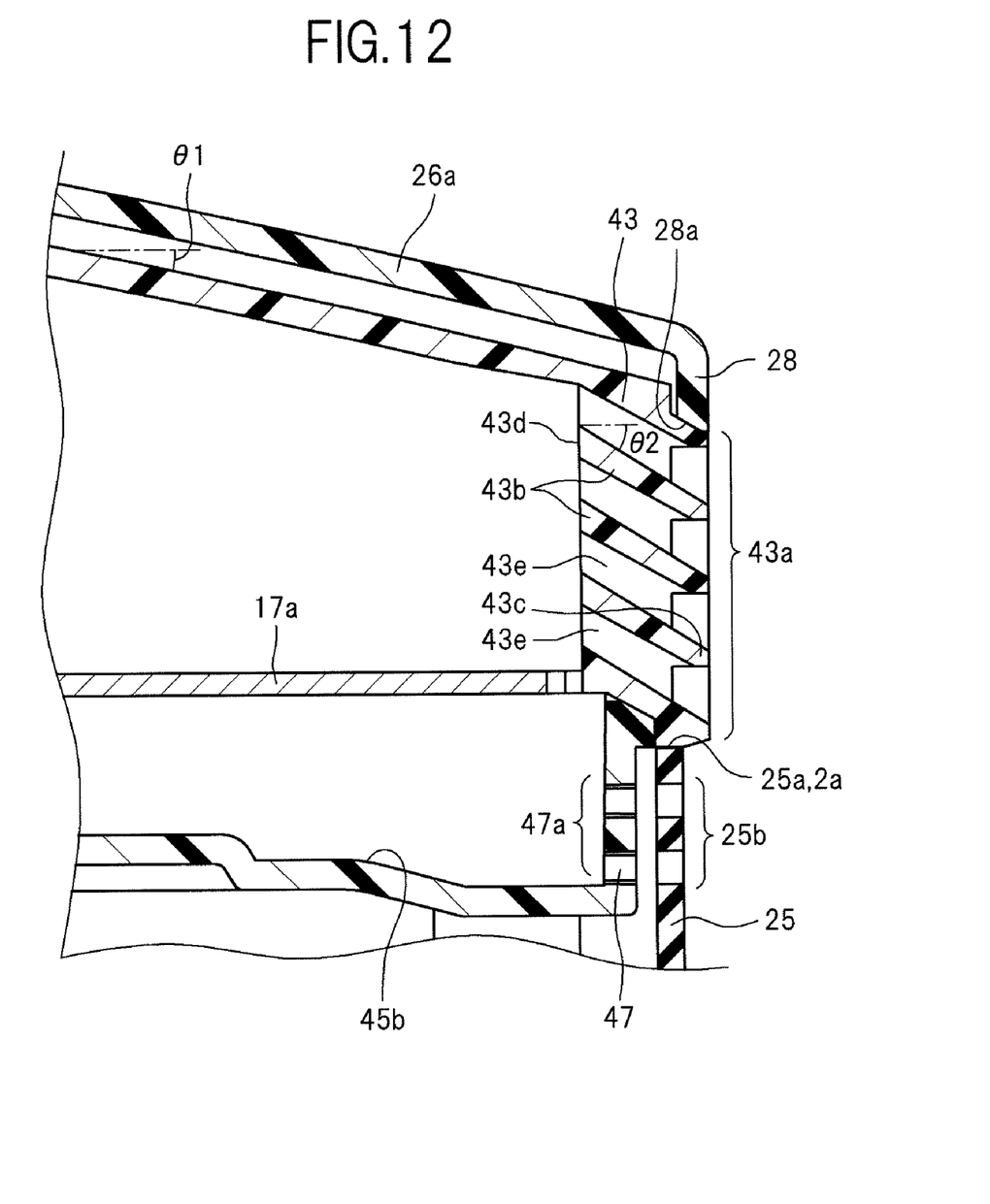
FIG. 12 is an enlarged view of FIG. 11.

An embodiment of the present invention is described below. FIG. 1 is a perspective view of an electronic apparatus 1 as an example according to the embodiment of the present invention. FIG. 2 is a plan view of the electronic apparatus 1 in a state in which an upper housing 26 is detached therefrom. FIG. 3 is a bottom view of the electronic apparatus 1. FIG. 4 is a back view of the electronic apparatus 1. FIG. 5 is a plan view of a cooling unit 10 of the electronic apparatus 1 and a power circuit case 4 housing a power circuit 17. FIG. 6 is an exploded perspective view of the cooling unit 10. FIG. 7 is an exploded perspective view of power circuit case 4. FIG. 8 is a front view of an upper wall member 40 constituting the power circuit case 4. FIG. 9 is a sectional view taken along the line IX-IX of FIG. 5. FIG. 10 is an enlarged view of FIG. 9. FIG. 11 is a sectional view taken along the line XI-XI of FIG. 5. FIG. 12 is an enlarged view of FIG. 11. In this regard, in FIGS. 7, 10, and 11, illustration of electronic components 17b mounted on a front surface side of a circuit board 17a of the power circuit 17 is omitted. In FIG. 9, the electronic components 17b are indicated by chain double-dashed lines.

As illustrated in FIG. 1, the electronic apparatus 1 includes a housing 2 forming an outer surface of the electronic apparatus 1. The housing 2 includes a lower housing 21 opening upward and the upper housing 26 arranged covering the lower housing 21 from above. The upper housing 26 is arranged such that a lower edge 26e thereof is laid on an upper edge 21b of the lower housing 21, to thereby close the lower housing 21 from above.

In this regard, the upper housing 26 has a plate-like upper plate portion 26a arranged facing the lower housing 21 in an up-and-down direction. The upper plate portion 26a is curved such that the central portion of the upper plate portion 26a in a front-rear direction (Y1-Y2 direction) swells upward. Further, the upper housing 26 has side wall portions 26f extending downward from right and left edges of the upper plate portion 26a, respectively. Still further, the upper housing 26 has, in a front portion thereof, a left front-wall portion 26b and a right front-wall portion 26c extending downward from a front edge of the upper plate portion 26a toward the lower housing 21. A game device or audio-visual equipment is exemplified as the electronic apparatus 1, in which a medium insertion slot 26d from which a portable storage medium such as an optical disc is inserted is formed in the right front-wall portion 26c. In addition, a front board 27, provided with buttons 27a for operating the electronic apparatus 1, is arranged in front of the right front-wall portion 26c.

As illustrated in FIG. 3 or 4, the lower housing 21 has a plate-like bottom portion 21a serving as the bottom of the lower housing 21. Further, the lower housing 21 has a front wall portion 23a standing upright on a front edge of the bottom portion 21a, and inner wall portions 23b standing upright on right and left edges of the bottom portion 21a, respectively. The lower housing 21 is formed projecting forward and laterally beyond the front wall portion 23a and the inner wall portions 23b. Therefore, the lower housing 21 has an outer bottom portion 22 spreading forward from an upper edge of the front wall portion 23a and spreading laterally from upper edges of the inner wall portions 23b. That is, the outer bottom portion 22 has a front bottom portion 22a spreading forward from the upper edge of the front wall portion 23a and located in the front portion of the lower housing 21. Further, the outer bottom portion 22 has right and left side bottom portions 22b spreading laterally from the upper edges of the inner wall portions 23b and located in right and left portions of the lower housing 21, respectively. In a use mode of the electronic apparatus 1, the bottom portion 21a faces a surface on which the electronic apparatus 1 is placed (hereinafter, referred to as installation surface), whereas the outer bottom portion 22 is spaced upward from the installation surface. Further, the lower housing 21 has outer wall portions 21c standing upright on the edges of the side bottom portions 22b, respectively. The side wall portions 26f of the upper housing 26 are arranged such that the lower edges of the side wall portions 26f are laid on the upper edges of the outer wall portions 21c.

The housing 2 has air vents 24 formed therein, which introduce the external air into the housing 2. In this example, the air vents 24 are formed in the front bottom portion 22a and the side bottom portions 22b, respectively. The air vents 24 are formed along the front wall portion 23a and the inner wall portions 23b standing upright on the edges of the bottom portion 21a. When a cooling fan 15 described below is driven, the air is introduced through the air vents 24. As described above, the lower housing 21 is formed projecting forward and laterally beyond the front wall portion 23a and the inner wall portions 23b.

As illustrated in FIG. 2, the electronic apparatus 1 includes the cooling unit 10 for cooling devices installed in the electronic apparatus 1, and the power circuit (corresponding to the heat generating device in claims) 17 for converting electric power supplied from the outside of the electronic apparatus 1 to electric power for driving each of the devices installed in the electronic apparatus 1. The cooling unit 10 and the power circuit 17 are arranged inside the housing 2. Further, the electronic apparatus 1 includes an optical disc drive 16 for reading storage medium inserted into the above-mentioned medium insertion slot 26d. In this example, the power circuit 17 is located in the rear portion of the housing 2, and the cooling unit 10 and the optical disc drive 16 are located in front of the power circuit 17. The cooling unit 10 and the optical disc drive 16 are arranged side by side.

As illustrated in FIG. 6 or 9, the cooling unit 10 includes a heat sink 13 and the cooling fan 15 for generating an air flow which receives heat of the heat sink 13. The cooling fan 15 and the heat sink 13 are disposed on a base plate 12, and the heat sink 13 is located outward, in a radial direction, of the cooling fan 15. In this example, the heat sink 13 is located posterior to the cooling fan 15. In this regard, an edge 13c of the heat sink 13 that is adjacent to the cooling fan 15 is curved to surround the cooling fan 15.

The cooling unit 10 is disposed above a circuit board (not shown). As illustrated in FIG. 9, the heat sink 13 is coupled with an integrated circuit 18 so that the heat of the integrated circuit 18 mounted on the circuit board is transmitted to the heat sink 13. In this example, a plurality of (two, in this example) plate-like heat-receiving blocks 12a are fixed onto a back surface (lower surface) of the base plate 12. The heat-receiving blocks 12a are held in contact with a front surface (upper surface) of the integrated circuit 18, and the heat of the integrated circuit 18 is transmitted to the base plate 12 via the heat-receiving blocks 12a. In this regard, a heat pipe 12b is also fixed onto the back surface of the base plate 12. The heat pipe 12b extends from the heat-receiving blocks 12a along the back surface of the base plate 12, and the heat received by the heat-receiving blocks 12a is transmitted to a wide area of the base plate 12 via the heat pipe 12b.

The heat sink 13 includes a plurality of fins 13a arranged parallel to the base plate 12, and a plurality of pillars 13b extending upward from the base plate 12. The heat of the base plate 12 is transmitted to the respective fins 13a via the pillars 13b.

As described above, the power circuit 17 is located in the rear of the cooling unit 10. In this example, the circuit board 17a of the power circuit 17 has a rectangular shape elongated in the right-left direction (X1-X2 direction) (see FIG. 7). The electronic components 17b, such as a condenser, a power transistor, and a transformer, are mounted on the front surface of the circuit board 17a (see FIG. 9). The power circuit 17 is housed in the power circuit case 4 formed separately from the housing 2.

The cooling unit 10 includes a heat sink cover 3 covering the heat sink 13 from above and guiding the air flow generated by driving of the cooling fan 15 (see FIG. 6). The power circuit case 4 is united with the heat sink cover 3. That is, the power circuit case 4 and the heat sink cover 3 are combined with each other such that one of a portion of the heat sink cover 3 through which the air flows out (opening 3a, in this example), and a portion of the power circuit case 4 through which the air flows in (cover 42e surrounding an air inlet 42a, in this example), receives the other. Further, the heat sink cover 3 and the power circuit case 4 constitute outer walls defining an air passage extending up to an air outlet 43a through which the air in the housing 2 is discharged to the outside.

Below, the power circuit case 4 housing the power circuit 17 and the cover covering the cooling unit 10 will be described in detail.

As illustrated in FIG. 6, a disc-like fan cover 14 is attached to the cooling fan 15, covering the cooling fan 15. A substantially circular air intake 14a is formed in the fan cover 14, and a plurality of fins 15a rotated by driving of the cooling fan 15 are exposed upward through the air intake 14a (see FIG. 5). By driving of the cooling fan 15, the air flows to the inside of the cooling unit 10 through the air intake 14a.

As described above, the cooling unit 10 includes the heat sink cover 3 covering the heat sink 13 from above and guiding the air flow generated by driving of the cooling fan 15. An opening 31a is formed in the heat sink cover 3. The opening 31a is located above the cooling fan 15, and the fan cover 14 is attached on an edge of the opening 31a. Specifically, the heat sink cover 3 includes a plurality of (two, in this example) attachment portions 31b located at the edge of the opening 31a. A plurality of attachment portions 14b are also formed at an outer peripheral edge of the fan cover 14, and the attachment portions 14b are fixed to the attachment portions 31b with screws.

The heat sink cover 3 includes a plate-like upper plate portion 31 located above the heat sink 13. As illustrated in FIG. 9, in a state in which the upper housing 26 covers the heat sink cover 3, the upper plate portion 31 is arranged along the upper plate portion 26a. As described above, the upper plate portion 26a is curved such that the center thereof in the front-rear direction swells upward. The upper plate portion 31 is curved in conformity with the upper plate portion 26a. Further, the fan cover 14 is located lower than the upper plate portion 31 of the heat sink cover 3, and is spaced from the upper plate portion 26a of the upper housing 26.

As illustrated in FIG. 5 or 6, the heat sink cover 3 includes a side wall portion 32 extending downward from the edge of the upper plate portion 31 and surrounding both the cooling fan 15 and the heat sink 13. The side wall portion 32 includes a first side wall portion 32a curved surrounding the cooling fan 15, and a second side wall portion 32b formed extending from the first side wall portion 32a in a circumferential direction of the cooling fan 15. The second side wall portion 32b is formed such that the distance between the second side wall portion 32b and the cooling fan 15 gradually increases as the second side wall portion 32b becomes further away from the first side wall portion 32a. Further, the side wall portion 32 includes a third side wall portion 32c extending rearward (toward the power circuit case 4) from the second side wall portion 32b and standing upright along the heat sink 13, and a fourth side wall portion 32d extending rearward (toward the power circuit case 4) from the first side wall portion 32a and standing upright along the heat sink 13.

The third side wall portion 32c and the fourth side wall portion 32d are formed to have an increasing distance therebetween as they extend rearward, that is, as they become closer to the power circuit case 4. In this example, the fourth side wall portion 32d is inclined such that the fourth side wall portion 32d becomes further away from the third side wall portion 32c as the fourth side wall portion 32d becomes closer to the power circuit case 4. In this regard, as illustrated in FIG. 6, a recess 32e provided for avoiding interference with the optical disc drive 16 adjacent to the cooling unit 10 is formed in the fourth side wall portion 32d.

By driving of the cooling fan 15, the air sucked through the air vents 24 of the housing 2 is introduced from the air intake 14a of the fan cover 14 into the heat sink cover 3. After that, the air flows in the radial direction owing to rotation of the fins 15a of the cooling fan 15. Then, the air is guided to the heat sink 13 by the heat sink cover 3. That is, the heat sink 13 is arranged on an air outlet side of the cooling fan 15. As illustrated in FIG. 6, the heat sink cover 3 opens toward the power circuit case 4, so that the air, which passes between the fins 13a of the heat sink 13, passes through the opening 3a located at the end portion of the heat sink cover 3 to flow into the power circuit case 4.

As described above, the power circuit 17 is housed in the power circuit case 4. In this example, the circuit board 17a of the power circuit 17 has a rectangular shape elongated in the right-left direction, and the power circuit case 4 has a substantially rectangular solid shape in conformity with a shape of the circuit board 17a. As illustrated in FIG. 7, the power circuit case 4 includes the upper wall member 40 covering the power circuit 17 from above, and a bottom wall member 45 covering the power circuit 17 from below.

The upper wall member 40 includes a substantially rectangular upper plate portion 41 located over the power circuit 17. The upper plate portion 41 is arranged on the back surface (lower surface) side of the upper plate portion 26a of the upper housing 26 and arranged along the upper plate portion 26a. In this example, the upper plate portion 26a is curved. Therefore, the upper plate portion 41 is inclined in conformity with the inclination of the upper plate portion 26a such that a rear edge of the upper plate portion 41 is lowered in position. Further, the upper wall member 40 has a box shape opening downward, and includes a front wall portion 42, a rear wall portion 43, and side wall portions 44 each extending downward from the edge of the upper plate portion 41 (see FIGS. 7 and 10).

The bottom wall member 45 includes a substantially rectangular plate-like bottom portion 45a arranged on the back surface (lower surface) side of the circuit board 17a, a front wall portion 46 standing upright on a front edge of the bottom portion 45a, and a rear wall portion 47 standing upright on a rear edge of the bottom portion 45a.

The upper wall member 40 is connected to the cooling unit 10 and forms the outer wall defining the air passage continuous with the cooling unit 10. In this example, the cooling unit 10 is provided with the heat sink cover 3. The upper wall member 40 is connected to the opening 3a of the heat sink cover 3 (see FIG. 10).

In detail, as illustrated in FIG. 8 or 10, the front wall portion 42 of the upper wall member 40 is arranged facing the heat sink 13. A grid-like air inlet 42a is formed in the front wall portion 42. The air inlet 42a is arranged facing a plane including the edge of the opening 3a and located close to the plane. As described below, the upper wall member 40 includes a cover 42e surrounding the air inlet 42a (see FIGS. 8 to 11). The cover 42e is formed extending toward the opening 3a and surrounding the opening 3a. Therefore, the cover 42e surrounds a space between the air inlet 42a and the opening 3a, whereby the air inlet 42a is connected to the opening 3a.

Further, the front wall portion 46 of the bottom wall member 45 is also arranged facing the heat sink 13. A grid-like air inlet 46a is also formed in the front wall portion 46 (see FIG. 7). The air inlet 46a is also arranged facing a plane including the edge of the opening 3a and located close to the plane. By arranging the air inlets 42a and 46a in this way, the air flowing out of the heat sink cover 3 passes through the air inlets 42a and 46a, and flows into the inside of the upper wall member 40 and the bottom wall member 45, that is, into the inside of the power circuit case 4.

The air inlets 42a and 46a are formed in conformity with a size of the opening 3a of the heat sink cover 3. That is, the air inlets 42a and 46a are located inside the opening 3a. In this example, as illustrated in FIG. 7 or 8, the air inlet 42a of the upper wall member 40 is only formed in a portion on one side (left side, in this example) in the right-left direction of the front wall portion 42. Similarly, the air inlet 46a of the bottom wall member 45 is only formed in a portion on one side (left side, in this example) in the right-left direction of the front wall portion 46.

As described above, the upper wall member 40 includes the cover 42e surrounding the opening 3a of the heat sink cover 3. As illustrated in FIGS. 8 to 11, the cover 42e includes an upper fin 42b and a pair of right and left side fins 42c and 42d. The opening 3a of the heat sink cover 3 is fitted to the inside of the upper fin 42b and the side fins 42c and 42d. In this example, the upper fin 42b is formed extending from the upper plate portion 41 and arranged along the upper plate portion 31 of the heat sink cover 3. The side fin 42c is arranged along the third side wall portion 32c of the heat sink cover 3, and the side fin 42d is arranged along the fourth side wall portion 32d. The upper fin 42b and the side fins 42c and 42d prevent the air in the heat sink cover 3 from flowing to the outside.

In this regard, as illustrated in FIG. 10, the front wall portion 46 of the bottom wall member 45 is disposed on the base plate 12. Sealing is effected between the base plate 12 and the lower surface of the bottom wall member 45. In detail, as illustrated in FIG. 6, a sealing member 19 extending along the edge of the base plate 12 is attached on the edge thereof. The sealing member 19 is sandwiched between the base plate 12 and the lower surface of the bottom wall member 45, thereby sealing between them.

As illustrated in FIG. 4, 7, or 10, an air outlet (air vent) 43a facing the air inlet 42a is formed in the rear wall portion 43 of the upper wall member 40. The air outlet 43a is larger than the air inlet 42a formed in the front wall portion 42. In this example, the air outlet 43a is formed in the entire region of the rear wall portion 43, so that a width of the air outlet 43a is larger than a width of the air inlet 42a.

As illustrated in FIG. 7 or 11, an air outlet (second air vent) 47a is also formed in the rear wall portion 47 of the bottom wall member 45. In this example, the air outlet 47a is only formed in part of the rear wall portion 47. Specifically, the air outlet 47a is only formed in a portion on one side (right side (on an X1 direction side), in this example) in the right-left direction of the rear wall portion 47. The air inlet 46a of the bottom wall member 45 is only formed in the portion on the left side (on an X2 direction side) of the front wall portion 46 as described above, so that the air outlet 47a is offset in position to the right with respect to the air inlet 46a. The air passage extending from the air inlet 46a to the air outlet 47a is located on the back surface side of the circuit board 17a of the power circuit 17. Since the air outlet 47a is offset in position to the right with respect to the air inlet 46a, it is possible to cool a wide area of the back surface of the circuit board 17a.

As illustrated in FIG. 10 or 11, the bottom wall member 45 and the upper wall member 40 are arranged facing each other in the up-and-down direction. The upper wall member 40 is fixed to the bottom wall member 45 such that the lower edge of the upper wall member 40 is laid on the upper edge of the bottom wall member 45. Further, the air flow entering from the air inlet 42a of the front wall portion 42 and the air inlet 46a of the front wall portion 46 passes the inside of the upper wall member 40 and the bottom wall member 45, and is then discharged from the air outlet 43a of the rear wall portion 43 and the air outlet 47a of the rear wall portion 47. That is, the air passage extending from the cooling unit 10 is surrounded from above, below, and both sides by the upper wall member 40 and the bottom wall member 45. The power circuit 17 arranged inside the upper wall member 40 and the bottom wall member 45 is located in the air passage defined by outer walls which the upper wall member 40 and the bottom wall member 45 forms. Therefore, the power circuit 17 is cooled by the air flowing in the air passage. In other words, the upper wall member 40 is fixed to the bottom wall member 45 such that the lower edge of the upper wall member 40 is laid on the upper edge of the bottom wall member 45, whereby the power circuit 17 is arranged in a space partitioned from the outside by the upper wall member 40 and the bottom wall member 45.

In this regard, the air passage extending from the cooling fan 15 to the air outlet 43a becomes gradually wider toward the air outlet 43a. In detail, as described above, the second side wall portion 32b of the heat sink cover 3 extends from the first side wall portion 32a in the circumferential direction of the cooling fan 15. This second side wall portion 32b is formed such that the distance between the second side wall portion 32b and the cooling fan 15 gradually increases as the second side wall portion 32b becomes further away from the first side wall portion 32a (becomes closer to the power circuit case 4). Further, the fourth side wall portion 32d of the heat sink cover 3 is inclined such that the fourth side wall portion 32d becomes further away from the third side wall portion 32c as the fourth side wall portion 32d becomes closer to the power circuit case 4. In addition, the upper wall member 40 has a width larger than a width (width in the right-left direction) of the heat sink cover 3, and the air outlet 43a is larger than the air inlet 42a. Accordingly, the air passage extending from the cooling fan 15 to the air outlet 43a becomes gradually wider toward the air outlet 43a.

The circuit board 17a of the power circuit 17 is supported spaced from the bottom portion 45a of the bottom wall member 45. In this example, as illustrated in FIG. 7, tubular fixing portions 45d protruding upward are formed on the bottom portion 45a of the bottom wall member 45. Screw holes are formed in the respective fixing portions 45d. Meanwhile, holes 17c are formed in the circuit board 17a at positions corresponding to the fixing portions 45d. The circuit board 17a is fixed to the fixing portions 45d with screws or bolts. The circuit board 17a is arranged on the fixing portions 45d in this way, so that the circuit board 17a is supported spaced from the bottom portion 45a of the bottom wall member 45. In this regard, besides the fixing portions 45d, plate-like small support portions 45c protruding upward are formed on the bottom portion 45a of the bottom wall member 45, and the support portions 45c also support the circuit board 17a.

As illustrated in FIG. 10 or 11, the air passage defined by the upper wall member 40 and the bottom wall member 45 includes a main passage F1 through which the air flow for cooling the power circuit 17 flows, and a bypass passage F2 partitioned from the main passage F1 by the circuit board 17a. In this example, the electronic components 17b having a large amount of heat generation are arranged on the front surface of the circuit board 17a. Therefore, the passage on the front surface side of the circuit board 17a, that is, the air passage defined by the circuit board 17a and the upper wall member 40, serves as the main passage F1 for cooling the power circuit 17. Further, the air passage on the back surface side of the circuit board 17a, that is, the air passage defined by the circuit board 17a and the bottom wall member 45, serves as the bypass passage F2.

In this regard, as illustrated in FIG. 7, 10, or 11, a deep bottom portion 45b which is deepest in the bottom portion 45a is formed in the bottom portion 45a of the bottom wall member 45. The deep bottom portion 45b ranges from the air inlet 46a toward the air outlet 47a. Therefore, the air entering from the air inlet 46a is allowed to flow smoothly up to the air outlet 47a.

As illustrated in FIG. 7, plate-like small attachment portions 40a, which face the bottom wall member 45 in the up-and-down direct ion, are formed at the lower edge of the upper wall member 40. Each of the attachment portions 40a has a hole formed therein. Meanwhile, the bottom wall member 45 has a plurality of tubular fixing portions 45e formed inside the edge thereof. Fasteners such as screws are fitted into the holes of the attachment portions 40a and the fixing portions 45e from above, whereby the upper wall member 40 is fixed to the bottom wall member 45. In this regard, a recess 41a is formed in the upper plate portion 41. A hole is also formed in the bottom of the recess 41a. The recess 41a is fixed to one of the fixing portions 45e with a screw or the like.

As illustrated in FIG. 4 or 12, the rear wall portion 43 having the air outlet 43a formed therein is exposed from the housing 2. In detail, an opening 2a having a shape corresponding to that of the rear wall portion 43 is formed in the housing 2, and the rear wall portion 43 is exposed through the opening 2a. In this example, the rear wall portion 43 of the upper wall member 40 is fitted in the opening 2a from the inside of the housing 2, and forms part of the outer surface of the electronic apparatus 1. Therefore, the air outlet 43a formed in the rear wall portion 43 also functions as an air outlet for discharging the air in the housing 2 to the outside of the housing 2. In other words, the air flowing inside the upper wall member 40 passes through the air outlet 43a, and is simultaneously ejected to the outside of the housing 2. In this way, the upper wall member 40 forms the outer wall defining the air passage which reaches the air outlet for ejecting the air from the housing 2.

In this example, the opening 2a formed in the housing 2 is defined by the upper housing 26 and the lower housing 21. The rear wall portion 43 is sandwiched by the upper housing 26 and the lower housing 21. In detail, the upper housing 26 includes a rear wall portion 28 extending downward from the rear edge of the upper plate portion 26a and forming the rear surface of the electronic apparatus 1. The lower edge of the rear wall portion 28 has a recess 28a formed therein and elongated in the right-left direction. Further, the lower housing 21 includes a rear wall portion 25 standing upright on the rear edge of the bottom portion 21a and forming the rear surface of the electronic apparatus 1. The upper edge of the rear wall portion 25 has a recess 25a formed therein and elongated in the right-left direction. The upper housing 26 and the lower housing 21 are combined with each other such that the recess 25a of the rear wall portion 25 and the recess 28a of the rear wall portion 28 face each other, whereby the opening 2a is defined. In this example, the rear wall portion 43 has a rectangular shape, and the opening 2a has a rectangular shape and a size corresponding to those of the rear wall portion 43.

As illustrated in FIG. 4 or 12, an air outlet 25b is formed in the rear wall portion 25 of the lower housing 21. The rear wall portion 47 of the bottom wall member 45 is located inside the housing 2 unlike the rear wall portion 43, and the air outlet 47a formed in the rear wall portion 47 faces the air outlet 25b.

As illustrated in FIG. 12, a plurality of louvers 43b for screening the inside of the power circuit case 4 from the outside thereof are provided on the air outlet 43a. In this example, each of the louvers 43b has a plate shape elongated in the right-left direction and bridges between right and left ends of the air outlet 43a (see FIG. 4). Further, the louvers 43b are inclined so as to screen the inside of the power circuit case 4 from the outside thereof. In this example, each of the louvers 43b is inclined such that a rear edge 43c of each of the louvers 43b is located lower than a front edge 43d thereof. The plurality of louvers 43b are aligned in the up-and-down direction. Two louvers 43b adjacent to each other in the up-and-down direction are arranged such that the two louvers 43b partially overlap each other in a back view of the electronic apparatus 1. That is, the front edge 43d of the upper louver 43b is positioned lower than the rear edge 43c of the lower louver 43b.

As described above, the upper plate portion 41 of the upper wall member 40 is inclined with the rear edge thereof descending in conformity with the upper plate portion 26a of the upper housing 26. An inclination angle of each louver 43b is larger than an inclination angle of the upper plate portion 41. That is, as illustrated in FIG. 12, an inclination angle $\theta 2$ of each louver 43b with respect to a horizontal plane is larger than an inclination angle $\theta 1$ of the upper plate portion 41 with respect to the horizontal plane. Since both the upper plate portion 41 and the louvers 43b are inclined, and besides the inclination angle of each louver 43b located at a downstream of the air passage with respect to the upper plate portion 41 is larger than the inclination angle of the upper plate portion 41, it is possible to increase an angle of an air discharge direction with respect to a horizontal direction while keeping the smooth air flow. In other words, when the upper plate portion 41 is horizontally arranged and the louvers 43b are largely inclined, an air flow direction is changed significantly depending on the louvers 43b. Meanwhile, as illustrated in FIG. 12, when both the upper plate portion 41 and the louvers 43b are inclined, the air in the upper space inside the power circuit case 4 also flows obliquely along the upper plate portion 41 before reaching the louvers 43b. Therefore, a change of the air flowing direction is reduced in the louvers 43b, and the smooth air flow can be maintained.

As illustrated in FIG. 12 or 4, a plurality of support portions 43e supporting the louvers 43b are formed between the louvers 43b. The plurality of support portions 43e arranged between two louvers 43b adjacent to each other in the up-and-down direction are aligned in the right-left direction at intervals. Further, the plurality of support portions 43e are also aligned in the up-and-down direction. Between the two louvers 43b adjacent to each other in the up-and-down direction, each of the support portions 43e is formed extending rearward along the louvers 43b. Therefore, the plurality of support portions 43e aligned in the up-and-down direction have a wall shape as a whole. As a result, when the electronic apparatus 1 is vertically installed, that is, when the electronic apparatus 1 is arranged such that the side wall portions 26f of the upper housing 26 and the outer wall portions 21c of the lower housing 21 face the installation surface, the support portions 43e prevent the inside of the power circuit case 4 from being seen from the outside. In this regard, an interval between two support portions 43e adjacent to each other is larger than an interval between the two louvers 43b adjacent to each other in the up-and-down direction. Therefore, an opening surrounded by the two support portions 43e adjacent to each other and the two louvers 43b adjacent to each other in the up-and-down direction is elongated in the right-left direction.

As described above, in the electronic apparatus 1, the upper wall member 40 is connected to the cooling unit 10 and forms the outer wall defining the air passage continuous to the cooling unit 10. Further, the power circuit 17, being an object to be cooled, is arranged in the air passage defined by the upper wall member 40.

According to such electronic apparatus 1, it is also possible to supply sufficient air flow to the power circuit 17 serving as a heat generating device, and to improve a cooling performance for the power circuit 17.

Note that the present invention is not limited to the above-mentioned electronic apparatus 1, and various modifications may be made.

For example, in the above description, both of the upper wall member 40 and the bottom wall member 45 serve as wall members forming the outer walls defining the air passage continuous to the cooling unit 10. However, only the upper wall member 40 may be arranged in the electronic apparatus 1 as the wall member.

Further, in the above description, the power circuit 17 being an object to be cooled is arranged on the downstream side in the air passage with respect to the cooling unit 10. That is, the power circuit 17 is arranged at a position towards which the air discharged from the cooling unit 10 flows. However, the power circuit 17 may be arranged on an upstream side of the cooling unit 10, that is, at a position toward which the air before being sucked in by the cooling fan 15 of the cooling unit 10 flows. In this case, a wall member is connected to the air intake of the cooling unit 10, and the wall member forms the outer wall defining the air passage at the upstream side of the cooling unit 10.

What is claimed is:

1. An electronic apparatus, comprising:
    a cooling unit including a heat sink, and a cooling fan for generating an air flow for receiving heat from of the heat sink;
    a cover provided for the cooling unit, and defining an airflow passage in the cooling unit;
    a wall member connected to the cover and forming an outer wall defining an airflow passage continuous with the airflow passage of the cooling unit;
    a heat generating device arranged in the airflow passage of the wall member and serving as an object to be cooled; and
    an air outlet provided at a downstream end of the airflow passage of the wall member,
    wherein the air outlet is located in a first direction from the cooling unit which defines a general air discharge direction of the cooling unit,
    wherein the wall member is wider than the cover in a second direction perpendicular to the first direction, and
    wherein the cover includes a side wall portion, the side wall portion being formed such that a width of the cover in the second direction increases toward a downstream end of the cover.

2. The electronic apparatus according to claim 1, wherein the wall member is arranged surrounding an opening of the cover.

3. The electronic apparatus according to claim 1, wherein the airflow passage of the wall member includes a main passage through which an air flow for cooling the heat generating device flows, and a bypass passage partitioned from the main passage.

4. The electronic apparatus according to claim 3, wherein:
    the heat generating device includes a circuit board having a front surface on which an electronic component is mounted;
    the main passage is defined as an air passage on the front surface side of the circuit board; and
    the bypass passage is defined as an air passage on a back surface side of the circuit board.

* * * * *